United States Patent
Reznicek et al.

(10) Patent No.: US 11,697,889 B2
(45) Date of Patent: Jul. 11, 2023

(54) THREE-DIMENSIONALLY STRETCHABLE SINGLE CRYSTALLINE SEMICONDUCTOR MEMBRANE

(71) Applicant: International Business Machines Corporation, Armonk, NY (US)

(72) Inventors: Alexander Reznicek, Troy, NY (US); Karthik Balakrishnan, Scarsdale, NY (US); Stephen W. Bedell, Wappingers Falls, NY (US); Pouya Hashemi, Purchase, NY (US); Bahman Hekmatshoartabari, White Plains, NY (US); Keith E. Fogel, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 568 days.

(21) Appl. No.: 16/719,088

(22) Filed: Dec. 18, 2019

(65) Prior Publication Data

US 2020/0123677 A1 Apr. 23, 2020

Related U.S. Application Data

(62) Division of application No. 15/849,088, filed on Dec. 20, 2017, now abandoned.

(51) Int. Cl.
*C30B 29/06* (2006.01)
*H01L 29/16* (2006.01)
(Continued)

(52) U.S. Cl.
CPC ............ *C30B 29/06* (2013.01); *B23B 3/30* (2013.01); *B32B 3/28* (2013.01); *B32B 3/30* (2013.01);
(Continued)

(58) Field of Classification Search
CPC ......... C30B 29/06; C30B 25/18; C30B 29/52; C30B 29/64; C30B 33/06;
(Continued)

(56) References Cited

U.S. PATENT DOCUMENTS

| 8,217,381 B2 | 7/2012 | Rogers et al. |
| 8,754,396 B2 | 6/2014 | Rogers et al. |

(Continued)

OTHER PUBLICATIONS

Office Action dated Jul. 13, 2020 received in the parent U.S. Patent Application, namely U.S. Appl. No. 15/849,088, Copy Not Enclosed.
(Continued)

*Primary Examiner* — Julia Slutsker
(74) *Attorney, Agent, or Firm* — Scully, Scott, Murphy & Presser, P.C.

(57) ABSTRACT

A structure including a three-dimensionally stretchable single crystalline semiconductor membrane located on a substrate is provided. The structure is formed by providing a three-dimensional (3D) wavy silicon germanium alloy layer on a silicon handler substrate. A single crystalline semiconductor material membrane is then formed on a physically exposed surface of the 3D wavy silicon germanium alloy layer. A substrate is then formed on a physically exposed surface of the single crystalline semiconductor material membrane. The 3D wavy silicon germanium alloy layer and the silicon handler substrate are thereafter removed providing the structure.

13 Claims, 7 Drawing Sheets

(51) Int. Cl.
| | |
|---|---|
| *H01L 29/04* | (2006.01) |
| *H01L 29/06* | (2006.01) |
| *H01L 21/683* | (2006.01) |
| *H01L 21/02* | (2006.01) |
| *H01L 23/498* | (2006.01) |
| *C30B 25/18* | (2006.01) |
| *C30B 33/06* | (2006.01) |
| *C30B 29/64* | (2006.01) |
| *H01L 21/18* | (2006.01) |
| *C30B 29/52* | (2006.01) |
| *B32B 3/30* | (2006.01) |
| *B23B 3/30* | (2006.01) |
| *B32B 3/28* | (2006.01) |

(52) U.S. Cl.
CPC .............. *C30B 25/18* (2013.01); *C30B 29/52* (2013.01); *C30B 29/64* (2013.01); *C30B 33/06* (2013.01); *H01L 21/0245* (2013.01); *H01L 21/0262* (2013.01); *H01L 21/02381* (2013.01); *H01L 21/02422* (2013.01); *H01L 21/02433* (2013.01); *H01L 21/02494* (2013.01); *H01L 21/02532* (2013.01); *H01L 21/02587* (2013.01); *H01L 21/02664* (2013.01); *H01L 21/185* (2013.01); *H01L 21/6835* (2013.01); *H01L 23/4985* (2013.01); *H01L 29/04* (2013.01); *H01L 29/0657* (2013.01); *H01L 29/16* (2013.01); *H01L 21/02598* (2013.01); *H01L 2221/68345* (2013.01); *H01L 2221/68381* (2013.01)

(58) Field of Classification Search
CPC ......... H01L 21/02381; H01L 21/02433; H01L 21/02422; H01L 21/0245; H01L 21/02494; H01L 21/02532; H01L 21/02587; H01L 29/04; H01L 29/0657; H01L 29/16; B23B 3/30; B32B 3/28; B32B 3/30

See application file for complete search history.

(56) References Cited

U.S. PATENT DOCUMENTS

| | | | |
|---|---|---|---|
| 8,895,448 | B2 | 11/2014 | Chen |
| 9,159,635 | B2 | 10/2015 | Elolampi et al. |
| 9,349,900 | B2 | 5/2016 | Rogers et al. |
| 9,516,758 | B2 | 12/2016 | Arora et al. |
| 2005/0136624 | A1 | 6/2005 | Cheng et al. |
| 2007/0224787 | A1 | 9/2007 | Weeks et al. |
| 2008/0014721 | A1 | 1/2008 | Bauer |
| 2008/0020547 | A1 | 1/2008 | Kostrzewa et al. |
| 2008/0157235 | A1* | 7/2008 | Rogers ................ H01L 29/0657 257/415 |
| 2008/0170982 | A1* | 7/2008 | Zhang .................. H01L 51/444 423/447.3 |
| 2010/0002402 | A1* | 1/2010 | Rogers .................. H05K 1/028 361/749 |
| 2015/0362722 | A1 | 12/2015 | Meier et al. |
| 2016/0329268 | A1 | 11/2016 | Howard et al. |

OTHER PUBLICATIONS

Delachat et al., "Fabrication of buckling free ultrathin silicon membranes by direct bonding with thermal difference," ACS Nano, Published Mar. 19, 2015, pp. 3654-3663, vol. 9, No. 4.

Kato et al., "Mechanism of selective etching of SiGe layers in SiGe/Si systems," ECS Transactions, May 6-10, 2007, pp. 245-251, vol. 6, No. 8.

Hartmann, J.M., et al., "Critical thickness for plastic relaxation of SiGe on Si(001) revisited", Journal of Applied Physics, Oct. 2011, 9 pages.

List of IBM Patents or Patent Applications Treated as Related dated Dec. 18, 2019, 2 pages.

* cited by examiner

THREE-DIMENSIONALLY STRETCHABLE SINGLE CRYSTALLINE SEMICONDUCTOR MEMBRANE

BACKGROUND

The present application relates to semiconductor technology. More particularly, the present application relates to a structure for use in internet-of-things (IoT) applications and wearable devices which includes a single crystalline semiconductor membrane that is stretchable in three-dimensions. The present application also provides a method of forming such a structure.

Internet-of-things (IoT) and wearable devices with transistors, sensors or MEMs need flexible and stretchable semiconductor material templates to be formed on. Current art typically uses polycrystalline silicon for such applications since silicon is easily biocompatible; polycrystalline silicon is silicon that consists of crystals variously oriented. There is need for providing improved stretchable semiconductor material templates that are superior over prior art polycrystalline silicon templates.

SUMMARY

A structure for use in internet-of-things (IoT) applications and wearable devices is provided. The structure includes a single crystalline semiconductor membrane that is stretchable in three-dimensions, i.e., along an x-axis, y-axis and z-axis. The single crystalline semiconductor membrane is present on a substrate which may include an elastomeric substrate or an oxide layer. A stretchable carrier substrate may or may not be present beneath the substrate.

In one aspect of the present application, a structure is provided. In one embodiment, the structure includes a three-dimensionally stretchable single crystalline semiconductor membrane located on a surface of a substrate.

In another aspect of the present application, a method is provided for forming such a structure. In one embodiment, the method may include providing a three-dimensional (3D) wavy silicon germanium alloy layer on a silicon handler substrate. A single crystalline semiconductor material membrane is then formed on a physically exposed surface of the 3D wavy silicon germanium alloy layer. A substrate is then formed on a physically exposed surface of the single crystalline semiconductor material membrane. The 3D wavy silicon germanium alloy layer and the silicon handler substrate are then removed providing a structure including the single crystalline semiconductor membrane located on the substrate. The single crystalline semiconductor membrane is stretchable in three-dimensions.

DETAILED DESCRIPTION

Figure 1:
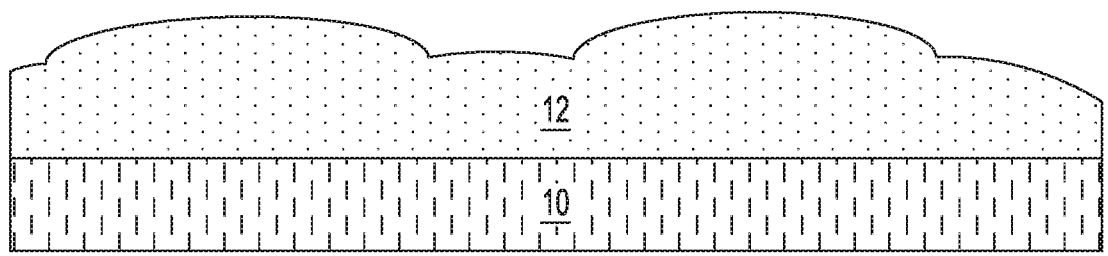
FIG. 1 is a cross sectional view of an exemplary structure that can be employed in accordance with an embodiment of the present application and including a three-dimensional (3D) wavy silicon germanium alloy layer located on a silicon handler substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure that can be employed in accordance with an embodiment of the present application. The exemplary structure of FIG. 1 includes a three-dimensional (3D) wavy silicon germanium alloy layer 12 located on a silicon handler substrate 10.

The silicon handler substrate 10 that can be employed in the present application is typically a single crystalline silicon material. The term "single crystalline" is used throughout the present application to denote a material in which the crystal lattice of the entire sample is continuous and unbroken to the edges of the sample. No grain boundaries are present in single crystalline materials. The term "single crystalline" may be used interchangeably with the term "monocrystalline".

The silicon handler substrate 10 may be an intrinsic silicon material. By "intrinsic" it is meant that the silicon material that provides the silicon handler substrate 10 contains no impurities atoms such as, for example, p-type dopants or n-type dopants. In another embodiment of the present application, the silicon handler substrate 10 may be an n-type or p-type doped silicon material. The term "n-type" refers to the addition of impurities to an intrinsic semiconductor material that contributes free electrons to the semiconductor material. In silicon, examples of n-type dopants, i.e., impurities, include, but are not limited to, antimony, arsenic and phosphorus. The term "p-type" refers to the addition of impurities to an intrinsic semiconductor material that creates deficiencies of valence electrons. In silicon, examples, of p-type dopants, i.e., impurities, include, but are not limited to, boron, aluminum, gallium and indium.

The silicon handler substrate 10 may have any of the well known crystallographic orientations. For example, the crystallographic orientation of the silicon handler substrate 10 may be {100}, {110} {111}. The silicon handler substrate 10 may have other crystallographic orientations besides those specifically mentioned in the present application. The silicon handler substrate 10 may have a thickness from 600 μm to 1000 μm. Other thicknesses for the silicon handler substrate 10 besides the range mentioned herein may also be employed.

The three-dimensional (3D) wavy silicon germanium alloy layer 12 is then formed on a physically exposed surface of the silicon handler substrate 10. The term "3D wavy" is used throughout the present application to denote a material that has an undulating topmost surface across the entire width and length of the layer.

The three-dimensional (3D) wavy silicon germanium alloy layer 12 is formed utilizing an epitaxial growth (or deposition) process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, the three-dimensional (3D) wavy silicon germanium alloy layer 12 has an epitaxial relationship with the physically exposed surface of the silicon handler substrate 10.

Examples of various epitaxial growth process apparatuses that can be employed in the present application include, e.g., reduced pressure chemical vapor deposition (RPCVD), rapid thermal chemical vapor deposition (RTCVD), and atmospheric pressure chemical vapor deposition (APCVD).

In order to provide the three-dimensional (3D) wavy silicon germanium alloy layer 12, the epitaxial growth is performed at a temperature of from 1000° C. to 1100° C., and at a pressure from 50 torr to 100 torr. These conditions are essential for providing the wavy nature of the deposited silicon germanium alloy that provides the three-dimensional (3D) wavy silicon germanium alloy layer 12. The epitaxial growth of the three-dimensional (3D) wavy silicon germanium alloy layer 12 is performed utilizing a precursor mixture of germanium tetrachloride ($GeCl_4$) and dichlorosilane ($H_2SiCl_2$). The use of this precursor mixture is also essential for providing the three-dimensional (3D) wavy silicon germanium alloy layer 12. In some embodiments of the present application, the precursor mixture used to provide the three-dimensional (3D) wavy silicon germanium alloy layer 12 is employed a ratio of $GeCl_4$ to $H_2SiCl_2$ of from 0.1 to 0.25. The precursor mixture may be present in a carrier gas such as, for example, hydrogen. The three-dimensional (3D) wavy silicon germanium alloy layer 12 that is provided is a relaxed silicon germanium alloy that comprises from 10 atomic percent to 20 atomic percent germanium.

Figure 2:
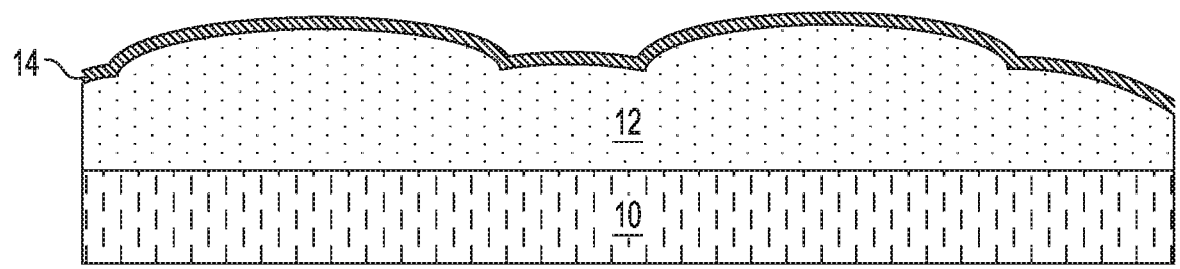
FIG. 2 is a cross sectional view of the exemplary structure of FIG. 1 after forming a single crystalline semiconductor material membrane on a physically exposed surface of the 3D wavy silicon germanium alloy layer.

Referring now to FIG. 2, there is illustrated the exemplary structure of FIG. 1 after forming a single crystalline semiconductor material membrane 14 on a physically exposed surface of the 3D wavy silicon germanium alloy layer 12.

The semiconductor material that can be used in providing the single crystalline semiconductor membrane 14 may include a material having semiconductor properties so long as the semiconductor material that provides the single crystalline semiconductor membrane 14 is compositionally different from the three-dimensional (3D) wavy silicon germanium alloy layer 12. That is, the semiconductor material that provides the single crystalline semiconductor membrane 14 must have a different etch rate as compared to the 3D wavy silicon germanium alloy layer 12. Examples of semiconductor materials that may provide the single crystalline semiconductor membrane 14 include silicon (Si), germanium (Ge), silicon germanium alloys (SiGe) having a different germanium content than the 3D wavy silicon germanium alloy layer 12, III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one example, the single crystalline semiconductor membrane 14 may be entirely composed of silicon.

Since the semiconductor material that provides the single crystalline semiconductor membrane 14 is compositionally different from the underlying three-dimensional (3D) wavy silicon germanium alloy layer 12, the single crystalline semiconductor membrane 14 is a strained layer. Thus, and in one example, the single crystalline semiconductor membrane 14 is composed of strained silicon.

The single crystalline semiconductor membrane 14 may be formed utilizing an epitaxial growth (or deposition) process. Since an epitaxial growth process is used in providing the single crystalline semiconductor membrane 14, the single crystalline semiconductor membrane 14 has an epitaxial relationship with the three-dimensional (3D) wavy silicon germanium alloy layer 12.

The epitaxial growth of the single crystalline semiconductor membrane 14 may be performed at a temperature of from 500° C. to 1000° C. In some embodiments, the epitaxial growth of the single crystalline semiconductor material 14 may be up to 1100° C. The epitaxial growth of the single crystalline semiconductor membrane 14 can be performed utilizing any well known precursor gas or gas mixture. In one example, a dichlorosilane is employed. Carrier gases like hydrogen, helium and argon can be used. In some embodiments, a dopant (n-type or p-type, as defined above) can added to the precursor gas or gas mixture.

The single crystalline semiconductor membrane 14 can have a thickness from 3 nm to 1000 nm. Other thicknesses that are above or below the aforementioned thickness range may also be employed as the thickness of the single crystalline semiconductor membrane 14. Since the growth surface below the single crystalline semiconductor membrane 14 is wavy, the single crystalline semiconductor membrane 14 that is formed is also 3D wavy. That is, the single crystalline semiconductor membrane 14 has an undulating topmost surface across the entire width and length thereof.

Figure 3:
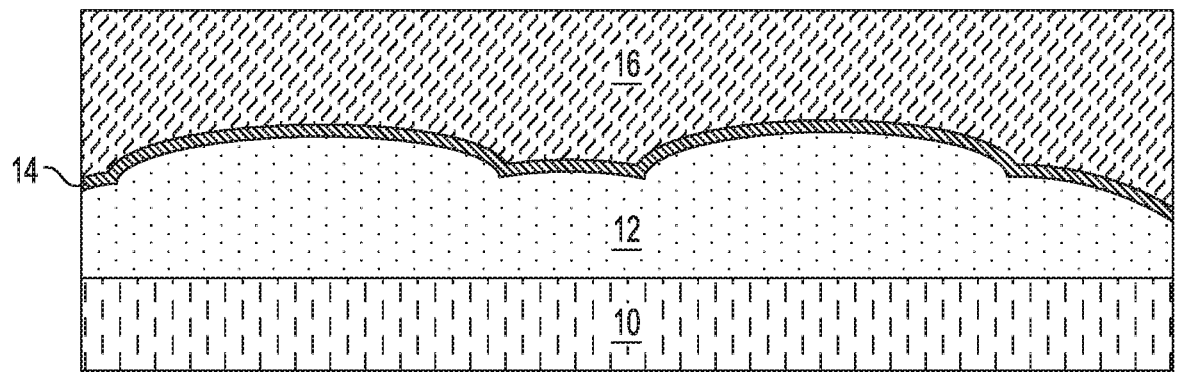
FIG. 3 is a cross sectional view of the exemplary structure of FIG. 2 after forming an elastomeric substrate on a physically exposed surface of the single crystalline semiconductor material membrane.

Referring now to FIG. 3, there is illustrated the exemplary structure of FIG. 2 after forming an elastomeric substrate 16 on a physically exposed surface of the single crystalline semiconductor material membrane 14.

The elastomeric substrate 16 may include any elastomer, i.e., any rubbery material that is composed of long chainlike molecules, or polymers, that are capable of recovering their original shape after being stretched to great extends. The monomers which link to form the elastomer are usually made of carbon, hydrogen, oxygen or silicon. Elastomers are amorphous polymers existing above their glass transition point, so that considerable segmental motion is possible. At ambient temperatures, the elastomers are typically soft and deformable.

In one embodiment, the elastomers that can be used as the elastomeric substrate 16 may include unsaturated rubbers such as, for example, natural polyisoprene, synthetic polyisoprene, polybutadiene, chloroprene rubber, butyl rubber, styrene-butadiene rubber or nitrile rubber. In another embodiment, the elastomers that can be used as the elastomeric substrate 16 may include saturated rubbers such as, for example, ethylene propylene rubber, epichlorohydrin rubber, polyacrylic rubber, silicone rubber, fluorosilicone rubber, fluoroeslatomers, perfluoroelastomers, polyether block amides, chlorosulfonated polyethylene or ethylene-vinylacetate. In yet a further embodiment, the elastomer that provides the elastomeric substrate 16 may include a thermoplastic elastomer, or a polysulfide rubber.

In some embodiments, the elastomer that is employed as the elastomeric substrate 16 is a biocompatible elastomer that may, or may not, be biodegradable. Examples of elastomers that are biocompatible include, but are not limited to, silicone, polyurethane, polycarbonate urethane, or poly(ester amide) elastomers, poly (lactic acid) (PLA), or poly (glycolic acid) (PGA).

The elastomeric substrate 16 can be formed utilizing a deposition process including, but not limited to, chemical vapor deposition (CVD), plasma enhanced chemical vapor deposition (PECVD) or spin-on coating.

Figure 4:
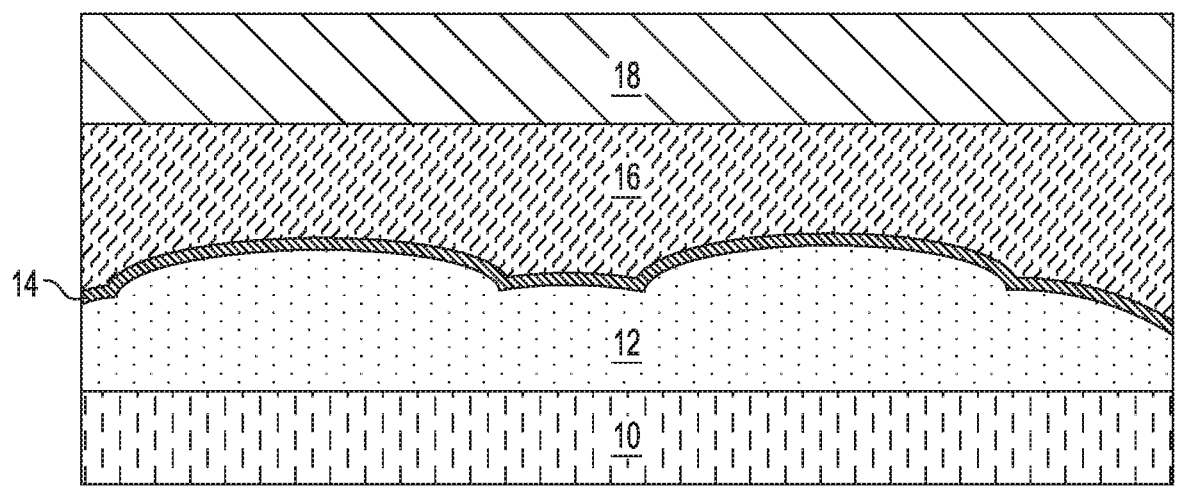
FIG. 4 is a cross sectional view of the exemplary structure of FIG. 3 after forming a stretchable carrier substrate on a physically exposed surface of the elastomeric substrate.

Referring now to FIG. 4, there is illustrated the exemplary structure of FIG. 3 after forming a stretchable carrier substrate 18 on a physically exposed surface of the elastomeric substrate 16. In some embodiments, the forming of the stretchable carrier substrate 18 on a physically exposed surface of the elastomeric substrate 16 can be omitted.

The stretchable carrier substrate 18 may include any flexible substrate such as, for example, a polyimide foil or tape. When a tape is employed, the tape may include a pressure sensitive tape. By "pressure sensitive tape," it is meant an adhesive tape that will stick with application of pressure, without the need for solvent, heat, or water for activation. Typically, the pressure sensitive tape that is employed in the present application includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added. Some examples of tapes that can be used in the present application as handle substrate 22 include, Nitto Denko 3193MS thermal release tape, Kapton KPT-1, and Diversified Biotech's CLEAR-170 (acrylic adhesive, vinyl base).

The stretchable carrier substrate 18 can be formed onto a physically exposed surface of the elastomeric substrate 16 by well known techniques such as, for example, deposition, bonding or adhering. The stretchable carrier substrate 18 can have a thickness from 1 μm to 100 μm. Other thicknesses that are above or below the aforementioned thickness range may also be employed as the thickness of the stretchable carrier substrate 18.

Figure 5:
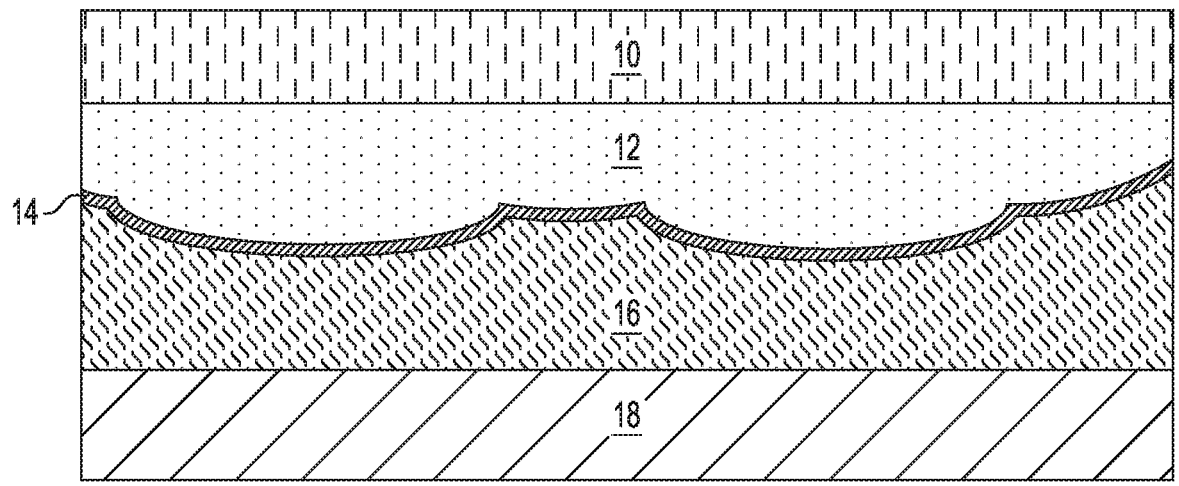
FIG. 5 is a cross sectional view of the exemplary structure of FIG. 4 after flipping the exemplary structure 180°.

Referring now to FIG. 5, there is illustrated the exemplary structure of FIG. 4 after flipping the exemplary structure 180°. In some embodiments, the exemplary structure shown in FIG. 3 may be flipped 180° and subjected to the processing illustrated in FIG. 6. In some embodiments, this step may be omitted. The flipping of the exemplary structure may be performed by hand or by utilizing a robot arm.

Figure 6:
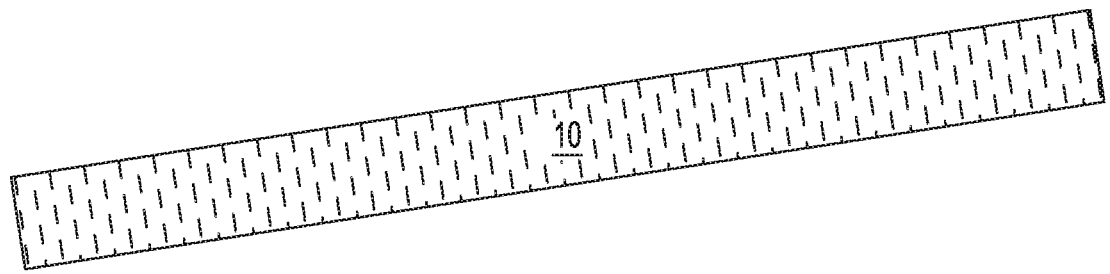
FIG. 6 is a cross sectional view of the exemplary structure of FIG. 5 after removing the 3D wavy silicon germanium alloy layer so as to release the silicon handler substrate from the structure.
Figure 6:
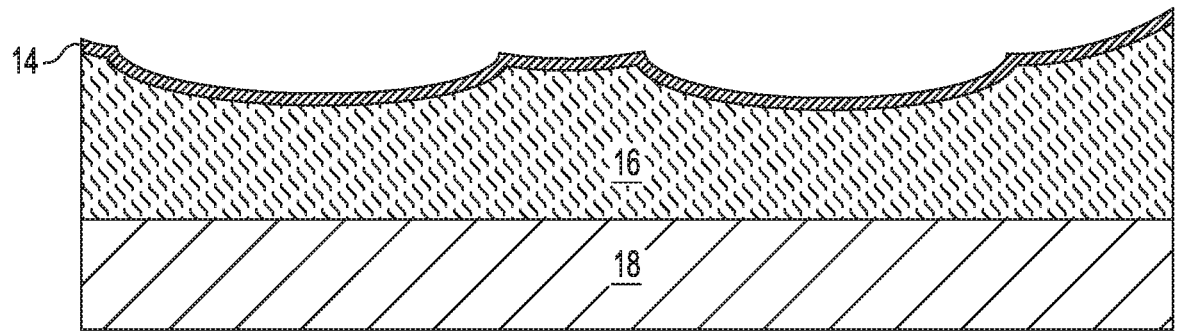

Referring now to FIG. 6, there is illustrated the exemplary structure of FIG. 5 after removing the 3D wavy silicon germanium alloy layer 12 so as to release the silicon handler substrate 10 from the structure. The removal of the 3D wavy silicon germanium alloy layer 12 may be performed by contacting edge portions of the 3D wavy silicon germanium alloy layer 12 with an etchant that is selective in removing the silicon germanium alloy that provides the 3D wavy silicon germanium alloy layer 12. In one example, hydrogen chloride (HCl) can be used as an etchant for removing the 3D wavy silicon germanium alloy layer 12.

The removal of the 3D wavy silicon germanium alloy layer 12 releases the silicon handler substrate 10 from the remaining portion of the structure, i.e., the single crystalline semiconductor material membrane 14, the elastomeric substrate 16, and, if present, the stretchable carrier substrate 18. The released silicon handler substrate 10 can be reused for other applications.

Figure 7:
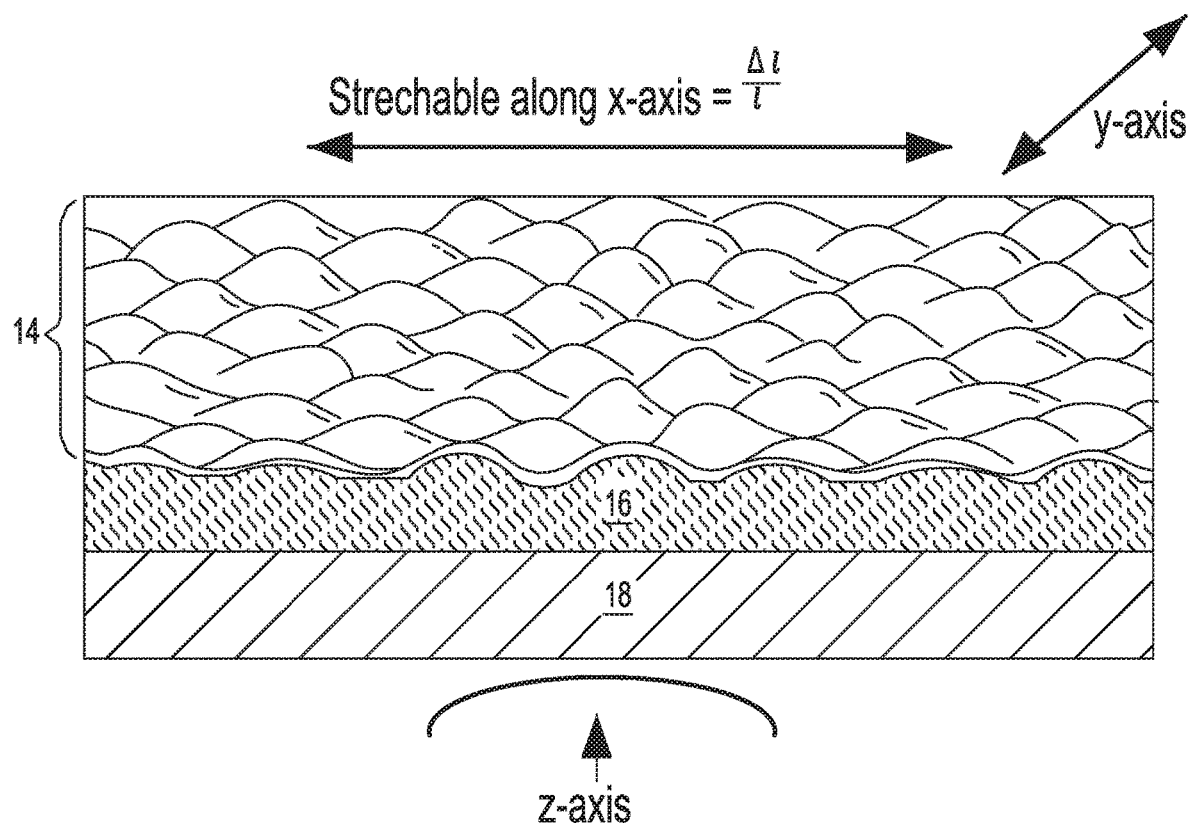
FIG. 7 is a cross sectional view of the exemplary structure of FIG. 6 highlighting the single crystalline semiconductor membrane of the present application that is capable of stretching in three-dimensions.

Referring now to FIG. 7, there is illustrated the exemplary structure of FIG. 6 highlighting the single crystalline semiconductor membrane 14 of the present application that is capable of stretching in three-dimensions, i.e., along an x-axis, y-axis and a z-axis. The resultant structure includes the single crystalline semiconductor material membrane 14 which has the wavy surface as is shown in FIG. 7, the elastomeric substrate 16, and, if present, the stretchable carrier substrate 18. In some embodiments, the resultant structure can be used in IOT applications. In another embodiment, the resultant structure can be used as a component of a wearable device. Whereas a conventional thin 2-dimensional "sheet" of a semiconductor material such as, for example, silicon, would possess a high degree of bendability, the in-plane stretchability is limited. A thin, wavy or corrugated single crystalline semiconductor membrane 14 as provided by the present application permits in addition to bendability, a high degree of in-plane stretchability. Stretchability is achieved by converting in-plane translation into bending moments near the peaks and troughs of the wavy single crystalline semiconductor membrane 14. The increased flexibility and stretchability enabled by the non-planar single crystalline semiconductor membrane 14 is better suited to biological application such as direct application to skin and tissue.

Figure 8:
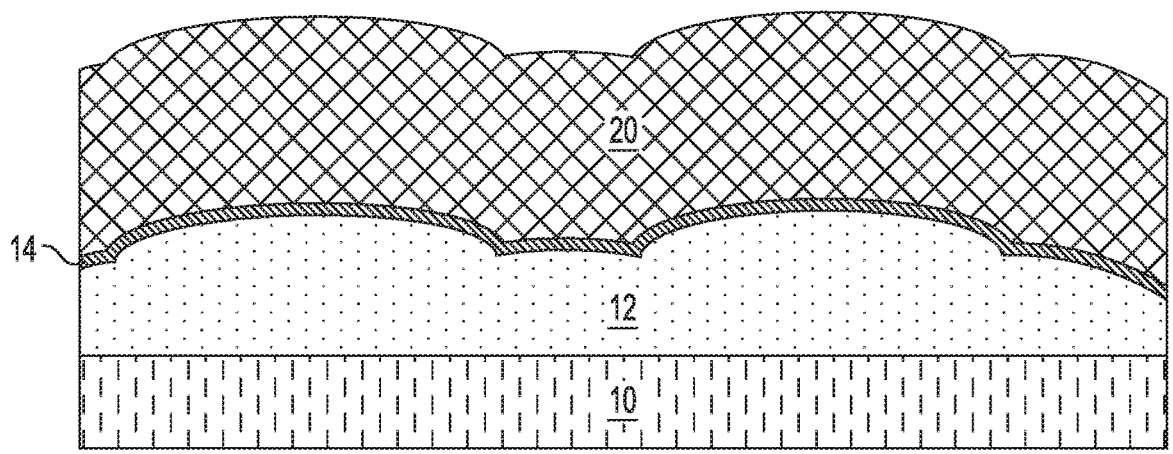
FIG. 8 is a cross sectional view of the exemplary structure of FIG. 2 after forming an oxide layer on a physically exposed surface of the single crystalline semiconductor material membrane.

Referring now to FIG. 8, there is illustrated the exemplary structure of FIG. 2 after forming an oxide layer 20 on a physically exposed surface of the single crystalline semiconductor material membrane 14.

The oxide layer 20 is a dielectric material such as, for example, a semiconductor oxide. In one embodiment, the semiconductor oxide may include silicon dioxide. In one embodiment, the oxide layer 20 may be formed utilizing a deposition process such as, for example, chemical vapor deposition (CVD), plasma enhanced chemical vapor deposition (PECVD) or physical vapor deposition. Additionally, the oxide may be formed using a spin-on oxide process which also has self-leveling properties. In some embodiments, the oxide layer 20 may be subjected to a densification anneal after the formation thereof.

The oxide layer 20 can have a thickness from 50 nm to 1000 nm. Other thicknesses that are above or below the aforementioned thickness range may also be employed as the thickness of the oxide layer 20.

Figure 9:
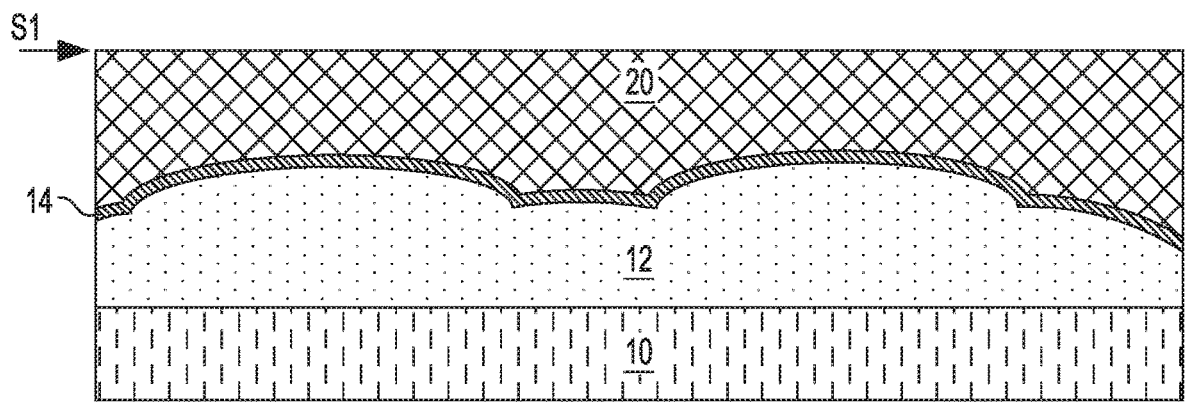
FIG. 9 is a cross sectional view of the exemplary structure of FIG. 8 after planarizing the oxide layer.

Referring now to FIG. 9, there is illustrated the exemplary structure of FIG. 8 after planarizing the oxide layer 20. The planarizing of the oxide layer 20 provides an oxide layer 20 having a planarized surface, S1. The planarizing of the oxide layer 20 may be performed utilizing chemical mechanical polishing and/or grinding.

Figure 10:
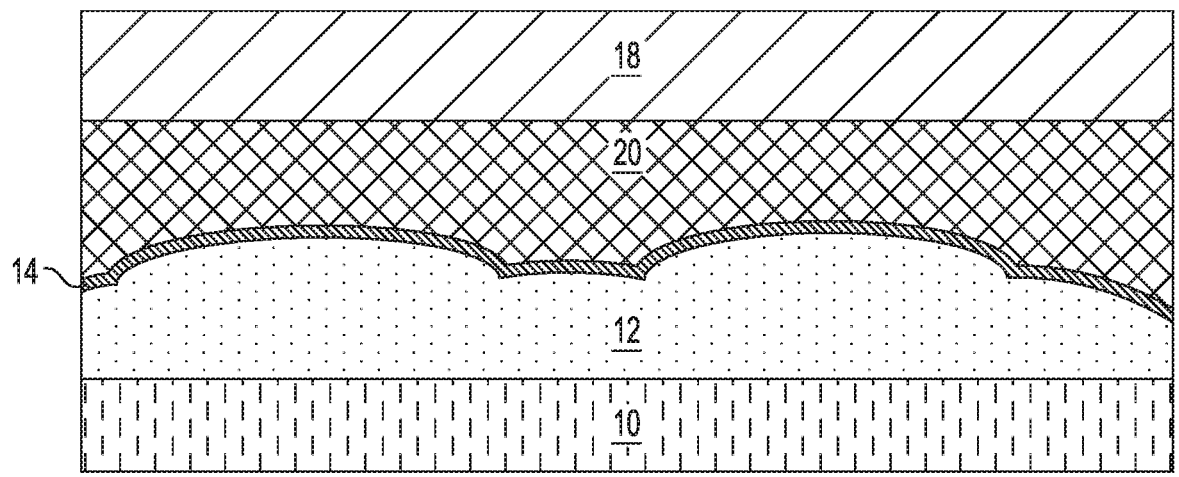
FIG. 10 is a cross sectional view of the exemplary structure of FIG. 9 after forming a stretchable carrier substrate on a physically exposed planarized surface of the oxide layer.

Referring now to FIG. 10, there is illustrated the exemplary structure of FIG. 9 after forming a stretchable carrier substrate 16 on a physically exposed planarized surface, S1, of the oxide layer 20. In some embodiments, the forming of the stretchable carrier substrate 18 on a physically exposed planarized surface, S1, of the oxide layer 20 can be omitted.

The stretchable carrier substrate 18 may include one of the flexible substrates mentioned in the previous embodiment of the present application. The stretchable carrier substrate 18 can be formed onto a physically exposed surface of the planarized oxide layer 20 by well known techniques such as, for example, deposition, bonding or adhering.

Figure 11:
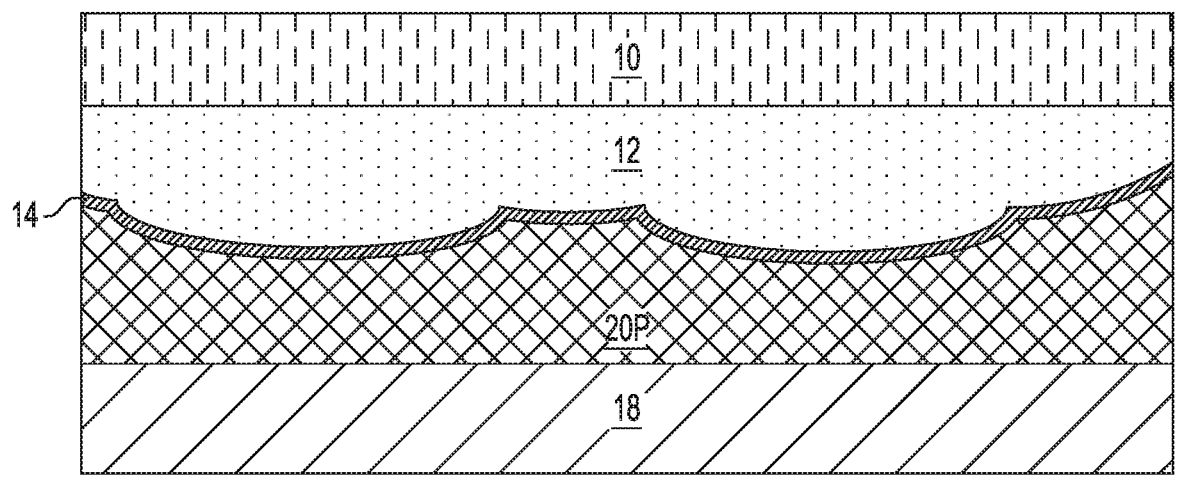
FIG. 11 is a cross sectional view of the exemplary structure of FIG. 10 after flipping the exemplary structure 180°.

Referring now to FIG. 11, there is illustrated the exemplary structure of FIG. 10 after flipping the exemplary structure 180°. In some embodiments, the exemplary structure shown in FIG. 9 may be flipped 180° and subjected to the processing illustrated in FIG. 12. In some embodiments, this step may be omitted. The flipping of the exemplary structure may be performed by hand or by utilizing a robot arm.

Figure 12:
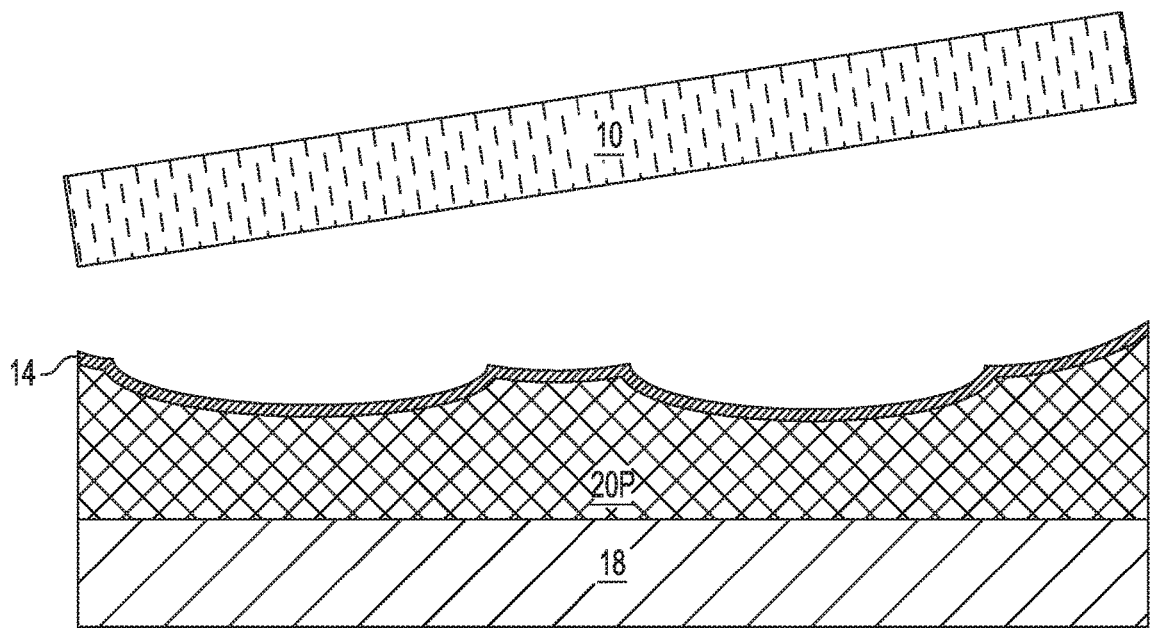
FIG. 12 is a cross sectional view of the exemplary structure of FIG. 11 after removing the 3D wavy silicon germanium alloy layer so as to release the silicon handler substrate from the structure.

Referring now to FIG. 12, there is illustrated the exemplary structure of FIG. 11 after removing the 3D wavy silicon germanium alloy layer 12 so as to release the silicon handler substrate 10 from the structure. The removal of the 3D wavy silicon germanium alloy layer 12 may be performed by contacting edge portions of the 3D wavy silicon germanium alloy layer 12 with an etchant that is selective in removing the silicon germanium alloy that provides the 3D wavy silicon germanium alloy layer 12. In one example, HCl can be used as an etchant for removing the 3D wavy silicon germanium alloy layer 12.

The removal of the 3D wavy silicon germanium alloy layer 12 releases the silicon handler substrate 10 from the remaining portion of the structure, i.e., the single crystalline semiconductor material membrane 14, the oxide layer 20, and, if present, the stretchable carrier substrate 18. The released silicon handler substrate 10 can be reused for other applications.

Figure 13:
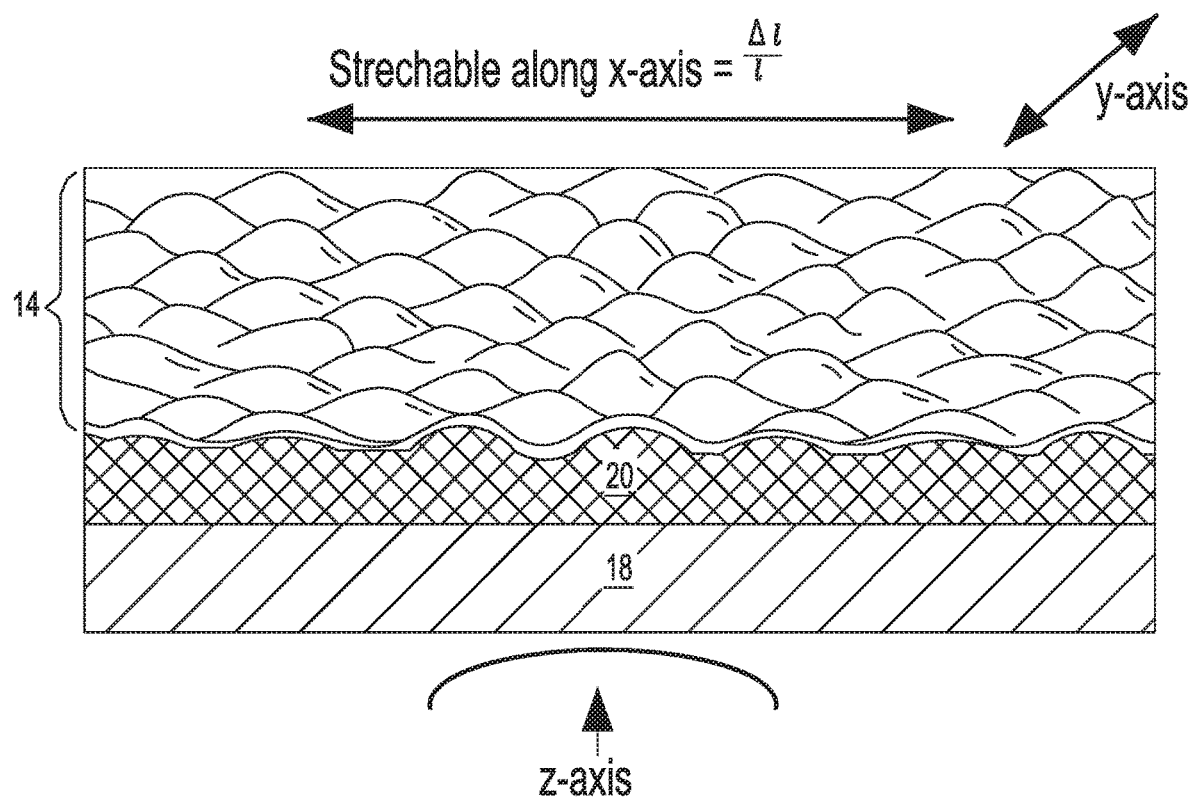
FIG. 13 is a cross sectional view of the exemplary structure of FIG. 12 highlighting the single crystalline semiconductor membrane of the present application that is capable of stretching in three-dimensions.

Referring now to FIG. 13, there is illustrated the exemplary structure of FIG. 12 highlighting the single crystalline semiconductor membrane 14 of the present application that is capable of stretching in three-dimensions along an x-axis, y-axis and a z-axis. The resultant structure includes the single crystalline semiconductor material membrane 14 which has the wavy surface as is shown in FIG. 13, the oxide layer 20, and, if present, the stretchable carrier substrate 18. In some embodiments, the resultant structure can be used in IOT applications. In another embodiment, the resultant structure can be used as a component of a wearable device. Whereas a conventional thin 2-dimensional "sheet" of a semiconductor material such as, for example, silicon, would possess a high degree of bendability, the in-plane stretchability is limited. A thin, wavy or corrugated single crystalline semiconductor membrane 14 as provided by the present application permits in addition to bendability, a high degree of in-plane stretchability. Stretchability is achieved by converting in-plane translation into bending moments near the peaks and troughs of the wavy single crystalline semiconductor membrane 14. The increased flexibility and stretchability enabled by the non-planar single crystalline semiconductor membrane 14 is better suited to biological application such as direct application to skin and tissue.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
    a three-dimensionally stretchable single crystalline semiconductor membrane located directly on a first surface of a dielectric oxide layer, wherein the single crystalline semiconductor membrane has a wavy surface; and
    a stretchable carrier substrate located directly on a second surface of the dielectric oxide layer, wherein the second surface is opposite the first surface, wherein the first surface of the dielectric oxide layer is wavy and the second surface of the dielectric oxide layer is entirely planar, and wherein the wavy surface of the single crystalline semiconductor membrane forms an interface with the first surface of the dielectric oxide layer.

2. The structure of claim 1, wherein the stretchable carrier substrate comprises a polyimide foil.

3. The structure of claim 1, wherein the stretchable carrier substrate comprises a tape.

4. The structure of claim 1, wherein the single crystalline semiconductor membrane comprises a strained semiconductor material.

5. The structure of claim 4, wherein the strained semiconductor material comprises strained silicon.

6. The structure of claim 1, wherein the wavy surface of the single crystalline semiconductor membrane is an undulating topmost surface that spans across an entire width and length thereof.

7. The structure of claim 1, wherein the single crystalline semiconductor membrane is bendable and has in-plane stretchability.

8. The structure of claim 1, wherein the single crystalline semiconductor membrane is non-planar.

9. A wearable device comprising:
 a three-dimensionally stretchable single crystalline semiconductor membrane located directly on a first surface of a dielectric oxide layer, wherein the three-dimensionally stretchable single crystalline semiconductor membrane has a wavy surface and is configured for direct application to skin of a human or tissue of a human; and
 a stretchable carrier substrate located directly on a second surface of the dielectric oxide layer, wherein the second surface is opposite the first surface, wherein the first surface of the dielectric oxide layer is wavy and the second surface of the dielectric oxide layer is entirely planar, and wherein the wavy surface of the single crystalline semiconductor membrane forms an interface with the first surface of the dielectric oxide layer.

10. The wearable device of claim 9, wherein the single crystalline semiconductor membrane is bendable and has in-plane stretchability.

11. The wearable device of claim 9, wherein the wavy surface of the single crystalline semiconductor membrane is an undulating topmost surface that spans across an entire width and length thereof.

12. The wearable device of claim 9, wherein the single crystalline semiconductor membrane comprises a strained semiconductor material.

13. The wearable device of claim 11, wherein the strained semiconductor material comprises strained silicon.

\* \* \* \* \*